United States Patent [19]

Bock

[11] 4,353,031
[45] Oct. 5, 1982

[54] ORTHOGONAL SIGNAL GENERATOR

[75] Inventor: Ditmar H. Bock, Colden, N.Y.

[73] Assignee: Calspan Corporation, Columbus, Ind.

[21] Appl. No.: 139,920

[22] Filed: Apr. 14, 1980

[51] Int. Cl.³ .............................................. H03K 3/01
[52] U.S. Cl. .................................... 328/62; 307/262; 307/471; 375/39
[58] Field of Search .................. 375/39; 307/106, 471, 307/262; 328/74, 59, 62; 343/203

[56] References Cited
U.S. PATENT DOCUMENTS

| | | | |
|---|---|---|---|
| 3,522,537 | 8/1970 | Boughtwood | 375/43 |
| 3,605,017 | 9/1971 | Chertok | 375/43 |
| 3,688,196 | 8/1972 | Doetz | 375/39 |
| 3,777,278 | 12/1973 | Majeau | 307/260 |

Primary Examiner—Harold A. Dixon
Attorney, Agent, or Firm—Biebel, French & Nauman

[57] ABSTRACT

The present invention discloses apparatus for generating a pair of mutually orthogonal signals having a bivariate amplitude distribution compatible with digital processors and having a frequency distribution substantially restricted to a band of frequencies centered on a high (carrier) frequency.

6 Claims, 6 Drawing Figures

ORTHOGONAL SIGNAL GENERATOR

BACKGROUND OF THE INVENTION

It is occasionally desired to generate two waveforms that are mutually orthogonal, i.e. that when multiplied by each other, yield a signal of zero average value, while, when each is multiplied by itself, each yields a signal of high average value. Often this is done by choosing sinusoidal signals at disparate frequencies or by using sine and cosine waves of the same frequency. Pseudo-random codes may be used to generate orthogonal signals with frequency content extending from zero frequency to some upper frequency, and these codes have the further advantage that, by having a bivariate amplitude, they can be communicated to, through, and from a digital computer or data link. Sources of band pass (rather than base band) signals compatible with digital processing are less available.

For example, it may be desired to transmit a message over a telephone or radio channel that has a bandwidth greater than the 300 to 3000 Hz range necessary for voice communication. Signaling might be possible in a band from, for example, 5 to 8 kHz, but the use of sinusoidal tones, even with suitable filtering, could cause annoying interference. Signaling with pseudo-random codes, as will be described hereinbelow, would be more acceptable, since they sound like a hiss, rather than a distracting, clear tone. For a general discussion of digital techniques used for signaling with psseudo-random codes or noises (PRN) see, for example, Mahlon F. Easterling, "Modulation by Pseudo-random Sequences", ch. 5 of *Digital Communications with Space Applications*, New Jersey: Prentice-Hall, Inc., 1964.

SUMMARY OF THE INVENTION

The present invention provides apparatus for generating a pair of mutually orthogonal signals which have a bivariate amplitude distribution, and thus are compatible with digital processing equipment and techniques, and which have a frequency distribution substantially restricted to a band of frequencies centered on a carrier frequency. A fixed frequency source is (1) supplied to a two-bit register, from which a pair of orthogonal essentially square wave signals are derived, and (2) supplied through a divider circuit as a clock signal to advance the shift registers of a PRN generator. The PRN generator is configured to produce as an output a pseudo-random code in the form of two signals, one of which is delayed with respect to the other. A pair of balanced modulator circuits each receive one of the PRN generator outputs and one of the pair of square wave signals, whereby the signals representing the pseudo-random code are modulated onto the orthogonal square wave signals. The outputs of the modulators thus provide a pair of orthogonally displaced carriers which are pseudo-random code modulated and can be used as carriers of information.

Essentially, then, the present invention provides an orthogonal signal generator, comprising: a source of clock pulses at a first frequency: means responsive to said clock pulses for generating second clock pulses at a second frequency which is a fraction of said first frequency; pseudo-random noise generating means responsive to said second clock pulses for generating a pseudo-random code in the form of two similar signals, one of which being delayed with respect to the other; register means responsive to said first mentioned clock pulses for generating a pair of orthogonal displaced pulse signals; and means for individually modulating one of said pair of displaced pulse signals with one of said two similar signals and the other of said pair of displaced pulses signals with the other of said two similar signals to thereby provide a pair of orthogonally displaced carriers which are orthogonally pseudo-random code modulated.

It is, accordingly, an object of the present invention to provide apparatus for generating two waveforms that are mutually orthogonal.

It is an additional object of the present invention to provide two orthogonal carriers whereby two signals can be simultaneously carried on the same wire or channel.

It is a further object of the present invention to provide apparatus for generating a pair of orthogonal signals having a bivariate amplitude distribution compatible with digital processors and a frequency distribution substantially restricted to a band of frequencies centered on a high (carrier) frequency.

These objects, and others as will become apparent hereinafter, are accomplished by the present invention.

BRIEF DESCRIPTION OF THE DRAWINGS

For a fuller understanding of the present invention reference should now be made to the following detailed description thereof taken in conjunction with the accompanying drawings wherein.

DESCRIPTION OF THE PREFERRED EMBODIMENT

Figure 1:
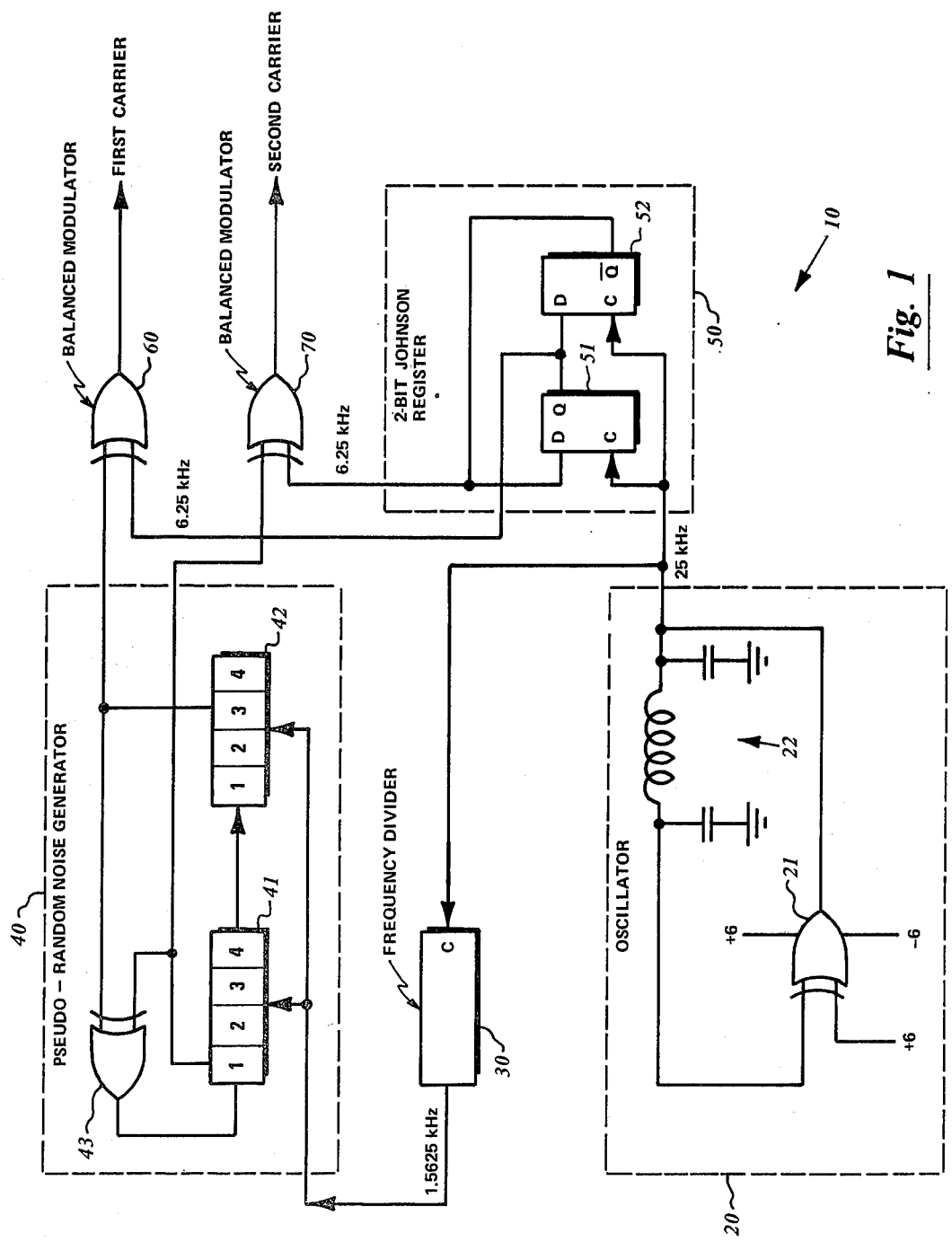
FIG. 1 illustrates a circuit diagram of the present invention with the major components thereof separated by blocks.

Referring now to the drawings and, more particularly, to FIG. 1 the orthogonal signal generator is generally depicted at 10 and comprises an oscillator 20, a frequency divider 30, a pseudo-random nose generator 40, a register 50 which is preferably of the 2-bit Johnson type, and a pair of a balanced modulators 60 and 70.

Oscillator 20 produces clock pulse signals at a fixed frequency, 25 kHz, for example. These clock pulse signals are supplied as an input to the frequency divider 30 and to the register 50.

Divider 30 reduces the 25 kHz signal by a factor of sixteen to a 1.5625 kHz signal which is fed as a clock signal to pseudo-random noise generator 40 which functions to generate a pseudo-random code of two identical signals, one of which is delayed with respect to the other. These signals are then fed to respective ones of a pair of balanced modulators 60 and 70 for the purpose of providing a random code modulation on carrier signals supplied to each of the modulators.

These carrier signals may be conveniently derived from the oscillator 20 through register 50 which functions to reduce the 25 kHz signals to a pair of 6.25 kHz square wave signals that are orthogonal with respect to each other.

Figure 2:
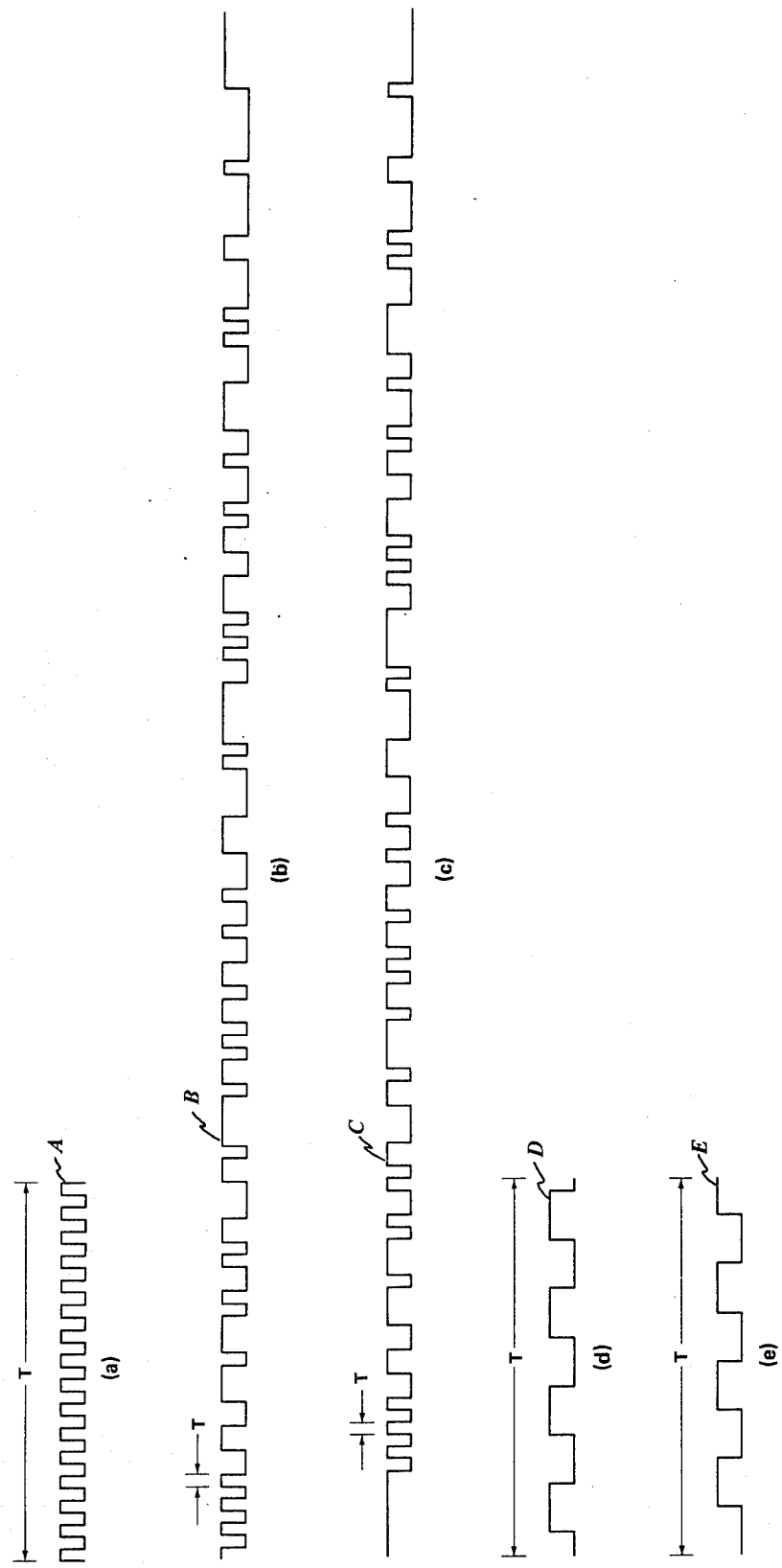
FIGS. 2a–2e graphically illustrate the relationship of the waveforms generated at various points by the circuit of FIG. 1, with T representing an equal time period in each Figure.

The oscillator 20 may comprise a square wave signal generator which utilizes an exclusive OR gate 21, configured as an inverter that, with feedback through a resonant circuit 22, produces oscillations at the resonance frequency thereof and such oscillations are converted to square waves by gate 21 as is well known. FIG. 2a depicts at A the 25 kHz square wave emanating from oscillator 20.

The frequency divider 30 may comprise a 4-stage binary counter which reduces the 25 kHz square wave signal from oscillator 20 to a 1.5625 kHz square wave signal which is fed as a clock signal to pseudo-random noise generator 40.

Generator 40 may comprise a pair of shift registers 41 and 42 (which are illustratively depicted as having eight cells, of which only seven are used). Registers 41 and 42 are each shifted by the clock signal supplied by divider 30, with register 41 producing a random code in the form of an undelayed signal as an input to modulator 70, whereas register 42 produces the same random code in the form of a signal which is delayed by the shifting action of registers 41 and 42 and is supplied to modulator 60. In this preferred arrangement, it can be seen that only one pseudo-random code is generated having a length of 127 since the zero state of each of the flip flops within registers 41 and 42 is excluded. This random code at the first tap of 41 is coherent with itself as any other waveform would be but is essentially incoherent with, or orthogonal to, the delayed version of itself appearing at the third tap of 42. See, for example, F. E. Nathanson, *Radar Design Principles,* Mc Graw-Hill, New York, 1969, pp 462–469 for further details of this type of pseudo-random noise generator circuit.

Although in theory a delay of one clock period between the two signals from pseudo-random noise generator 40 would suffice to obtain the required orthogonality, in practice such a delay could be cancelled by a quirk of the medium, such as thaat caused by dispersion or distortion. Therefore, it has been found that a delay of seven clock periods is more reliable in achieving the desired orthogonal relationship between the signals. Of course, other delays as well as other shifting frequencies could be employed. FIG. 2b depicts at B the pulse train emanating from shift register 41, whereas FIG. 2c depicts at C the delayed pulse train emanating from shift register 42.

In FIG. 1, the register 50 is depicted as a 2-bit Johnson register having D flip flops 51 and 52. As is well known, the Johnson register or counter 50 (also sometimes called a "twist-tail" register) is a binary recirculating shift register of N stages with a single reversal of data polarity usually within the recirculation path. This type of register is normally used as a counter inasmuch as it has the property of circulating a block of N ones followed by a block of N zeros, if initially loaded with all ones. Since it takes 2 N shift pulses to circulate the interface between the ones block and the zeros block once, and since this interface can be sensed at each register cell by a two term gate, only 2 N of these gates are required to define all states. This type of register, when containing two stages as in the present invention, has the special feature of generating two square waves, at one quarter of the clock frequency and shifted one clock pulse (the equivalent of 90° in phase) from each other. In other words, this type of register generates the orthogonal Walsh functions of sequency one quarter or the square wave equivalent of sine and cosine waves. For a more detailed description of registers of the 2-bit Johnson type see, for example, *RCA Integrated Circuits,* RCA Corporation, Somerville, N.J., 1976, pp 398–404 and 413–415. The signal emanating from the Q output of register 51 is depicted at D in FIG. 2d, whereas the signal from the $\overline{Q}$ output of register 52 is depicted at E in FIG. 2e.

Referring again to FIG. 1, the balanced modulators 60 and 70 may each comprise exclusive OR gates, the inverse of which serve as multipliers for bivariate input signals supplied thereto in a manner that would be analogous to a balanced mixer in the case of one bivariate signal and one continuous signal. Thus, the signal supplied to exclusive OR gate 60 from register 51 is modulated by the delayed pseudo-random noise signal supplied from shift register 42 and the signal supplied to exclusive OR gate 70 is modulated by the undelayed pseudo-random noise signal supplied from shift register 41. In this manner the output from modulators 60 and 70 comprise a pair of pseudo-random code modulated, orthogonal signals which can carry information on a wire or on a channel as simultaneous signals.

Each of the exclusive OR gates 21, 43, 60 and 70 can be implemented by ¼ of an RCA CD-4030 circuit. The shift registers 41 and 42 can each be ½ of an RCA CD 4015 dual shift register. The frequency divider's 4-stage binary counter 30 can be ½ of an RCA CD-4520 circuit. The two flip flop registers 51 and 52 can each be ½ of an RCA CD-4013 circuit.

Although a preferred embodiment of the present invention has been illustrated and described, changes will obviously occur to those skilled in the art. For example, other oscillator frequencies can be employed as well as other multiples thereof and other delay periods can be used without affecting the basic operation of the present invention. It is therefore intended that the presented invention is to be limited only by the scope of the appended claims.

I claim:

1. An orthogonal signal generator, comprising;
   (a) a source of clock pulses at a fixed frequency,
   (b) pseudo-random noise generating means responsive to said clock pulses for generating a pseudo-random code in the form of two signals one of which is delayed with respect to the other,
   (c) means for generating a pair of orthogonal carrier signals, and
   (d) means for modulating one of said two signals onto one of said pair of orthogonal carrier signals and the other of said two signals onto the other of said pair of orthogonal carrier signals.
2. The generator according to claim 1, wherein;
   (e) each of said pair of orthogonal carrier signals are square wave signals.
3. The generator according to claim 2, wherein;
   (f) said means for generating said pair of orthogonal carrier signals comprises a 2-bit Johnson register responsive to said source of clock pulses.
4. The generator according to claim 3, further comprising;
   (g) a frequency divider located between said source of clock pulses and said pseudo-random noise generating means for reducing said fixed frequency pulses supplied thereto.
5. The generator according to claim 1, wherein;
   (e) said means for generating said pair of orthogonal carrier signals comprises a 2-bit Johnson register responsive to said source of clock pulses.
6. The generator according to claim 1, further comprising;
   (e) a frequency divider located between said source of clock pulses and said pseudo-random noise generating means for reducing said fixed frequency pulses supplied thereto.

* * * * *